(12) United States Patent
Lower et al.

(10) Patent No.: US 8,637,980 B1
(45) Date of Patent: Jan. 28, 2014

(54) ADHESIVE APPLICATIONS USING ALKALI SILICATE GLASS FOR ELECTRONICS

(75) Inventors: Nathan P. Lower, North Liberty, IA (US); Alan P. Boone, Swisher, IA (US); Ross K. Wilcoxon, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 9 days.

(21) Appl. No.: 11/959,225

(22) Filed: Dec. 18, 2007

(51) Int. Cl.
*H01L 23/34* (2006.01)

(52) U.S. Cl.
USPC .......... 257/713; 257/678; 257/701; 257/794; 257/E23.009; 257/E23.116

(58) Field of Classification Search
USPC .......... 257/778, 713, 678, 701, 794, E23.009, 257/E23.116; 428/426; 438/108, 713
See application file for complete search history.

(56) References Cited

U.S. PATENT DOCUMENTS

| | | | |
|---|---|---|---|
| 3,508,974 A | 4/1970 | Bressler | |
| 3,654,528 A | 4/1972 | Barkan | |
| 3,723,790 A | 3/1973 | Dumbaugh et al. | |
| 3,812,404 A | 5/1974 | Barkan et al. | |
| 4,177,015 A | 12/1979 | Davidson | |
| 4,294,658 A | 10/1981 | Humphreys et al. | |
| 4,410,874 A | 10/1983 | Scapple et al. | |
| 4,505,644 A | 3/1985 | Meisner et al. | |
| 4,513,029 A | 4/1985 | Sakai | |
| 4,560,084 A | 12/1985 | Wolfson | |
| 4,572,924 A | 2/1986 | Wakely et al. | |
| 4,622,433 A | 11/1986 | Frampton | |
| 4,761,518 A | 8/1988 | Butt et al. | |
| 4,765,948 A | 8/1988 | Deluca et al. | |
| 4,773,826 A | 9/1988 | Mole | |
| 4,802,531 A | 2/1989 | Nathenson et al. | |
| 4,882,212 A | 11/1989 | SinghDeo et al. | |
| 4,963,503 A | 10/1990 | Aoki et al. | |
| 5,041,342 A | 8/1991 | Umeda et al. | |
| 5,136,365 A | 8/1992 | Pennisi et al. | |
| 5,140,109 A | 8/1992 | Matsumoto et al. | |
| 5,184,211 A | 2/1993 | Fox | |
| 5,195,231 A | 3/1993 | Fanning et al. | |
| 5,232,970 A | 8/1993 | Solc et al. | |
| 5,244,726 A * | 9/1993 | Laney et al. ............... 428/312.6 |
| 5,265,136 A | 11/1993 | Yamazaki et al. | |
| 5,288,769 A | 2/1994 | Papageorge et al. | |
| 5,315,155 A | 5/1994 | O'Donnelly et al. | |

(Continued)

FOREIGN PATENT DOCUMENTS

| JP | 55-100042 | * | 1/1980 |
|---|---|---|---|
| JP | 55-120083 | | 9/1980 |

(Continued)

OTHER PUBLICATIONS

U.S. Appl. No. 12/286,207, filed Sep. 29, 2008, Lower et al.

(Continued)

*Primary Examiner* — Andy Huynh
(74) *Attorney, Agent, or Firm* — Donna P. Suchy; Daniel M. Barbieri

(57) ABSTRACT

An assembly includes an integrated circuit die coupled to another component of the assembly with an alkali silicate glass material. The alkali silicate material may include particles for modifying the thermal, mechanical, and/or electrical characteristics of the material.

23 Claims, 4 Drawing Sheets

(56) References Cited

U.S. PATENT DOCUMENTS

| | | | | |
|---|---|---|---|---|
| 5,405,808 | A | 4/1995 | Rostoker et al. | |
| 5,502,889 | A | 4/1996 | Casson et al. | |
| 5,581,286 | A | 12/1996 | Hayes et al. | |
| 5,686,703 | A | 11/1997 | Yamaguchi | |
| 5,690,837 | A * | 11/1997 | Nakaso et al. | 216/17 |
| 5,702,963 | A | 12/1997 | Vu et al. | |
| 5,863,605 | A | 1/1999 | Bak-Boychuk et al. | |
| 5,916,944 | A | 6/1999 | Camilletti et al. | |
| 5,958,794 | A | 9/1999 | Bruxvoort et al. | |
| 5,965,947 | A | 10/1999 | Nam et al. | |
| 5,991,351 | A | 11/1999 | Woolley | |
| 6,010,956 | A | 1/2000 | Takiguchi et al. | |
| 6,019,165 | A | 2/2000 | Batchelder | |
| 6,021,844 | A | 2/2000 | Batchelder | |
| 6,027,791 | A * | 2/2000 | Higashi et al. | 428/209 |
| 6,028,619 | A | 2/2000 | Saita et al. | |
| 6,039,896 | A | 3/2000 | Miyamoto et al. | |
| 6,048,656 | A * | 4/2000 | Akram et al. | 438/118 |
| 6,087,018 | A | 7/2000 | Uchiyama | |
| 6,110,656 | A | 8/2000 | Eichorst et al. | |
| 6,121,175 | A | 9/2000 | Drescher et al. | |
| 6,124,224 | A | 9/2000 | Sridharan et al. | |
| 6,159,910 | A | 12/2000 | Shimizu et al. | |
| 6,356,334 | B1 | 3/2002 | Mathew et al. | |
| 6,370,015 | B2 | 4/2002 | Noda et al. | |
| 6,423,415 | B1 | 7/2002 | Greene et al. | |
| 6,451,283 | B1 | 9/2002 | Kuznicki et al. | |
| 6,452,090 | B2 | 9/2002 | Takato et al. | |
| 6,486,087 | B1 | 11/2002 | Saling et al. | |
| 6,496,359 | B2 | 12/2002 | Clark et al. | |
| 6,541,083 | B1 | 4/2003 | Landa et al. | |
| 6,541,832 | B2 | 4/2003 | Coyle | |
| 6,586,087 | B2 | 7/2003 | Young | |
| 6,599,643 | B2 | 7/2003 | Heimann et al. | |
| 6,617,041 | B2 | 9/2003 | Hahn et al. | |
| 6,624,276 | B2 | 9/2003 | Lamers et al. | |
| 6,658,861 | B1 | 12/2003 | Ghoshal et al. | |
| 6,663,793 | B2 | 12/2003 | Parkhill et al. | |
| 6,664,567 | B2 | 12/2003 | Kyoda et al. | |
| 6,665,186 | B1 | 12/2003 | Calmidi et al. | |
| 6,708,501 | B1 | 3/2004 | Ghoshal et al. | |
| 6,798,072 | B2 | 9/2004 | Kajiwara et al. | |
| 6,800,326 | B1 * | 10/2004 | Uchiyama | 427/309 |
| 6,800,330 | B2 | 10/2004 | Hayashi et al. | |
| 6,918,984 | B2 | 7/2005 | Murray et al. | |
| 6,960,878 | B2 | 11/2005 | Sakano et al. | |
| 6,986,859 | B2 | 1/2006 | Mazany et al. | |
| 7,045,905 | B2 | 5/2006 | Nakashima | |
| 7,078,263 | B2 | 7/2006 | Dean | |
| 7,114,251 | B2 | 10/2006 | Mashino | |
| 7,131,286 | B2 | 11/2006 | Ghoshal et al. | |
| 7,175,937 | B2 | 2/2007 | Cho et al. | |
| 7,176,564 | B2 | 2/2007 | Kim | |
| 7,202,598 | B2 | 4/2007 | Juestel et al. | |
| 7,265,977 | B2 | 9/2007 | Martin et al. | |
| 7,293,416 | B2 | 11/2007 | Ghoshal | |
| 7,296,417 | B2 | 11/2007 | Ghoshal | |
| 7,297,206 | B2 | 11/2007 | Naruse et al. | |
| 7,307,286 | B2 | 12/2007 | Ito et al. | |
| 7,327,039 | B2 | 2/2008 | Charles et al. | |
| 7,340,904 | B2 | 3/2008 | Sauciuc et al. | |
| 7,342,787 | B1 | 3/2008 | Bhatia | |
| 7,348,665 | B2 | 3/2008 | Sauciuc et al. | |
| 7,365,984 | B2 | 4/2008 | Jeong | |
| 7,391,060 | B2 | 6/2008 | Oshio | |
| 7,441,087 | B2 | 10/2008 | Hakura et al. | |
| 7,473,460 | B2 | 1/2009 | Meguro et al. | |
| 7,476,981 | B2 | 1/2009 | Bergmann et al. | |
| 7,491,431 | B2 | 2/2009 | Chiruvolu et al. | |
| 7,497,961 | B2 | 3/2009 | Keenan et al. | |
| 7,651,556 | B2 | 1/2010 | Komiyama et al. | |
| 7,671,468 | B2 | 3/2010 | Kanazawa et al. | |
| 7,692,259 | B2 | 4/2010 | Suehiro | |
| 7,709,093 | B2 | 5/2010 | Makowski et al. | |
| 7,737,356 | B2 | 6/2010 | Goldstein | |
| 7,910,403 | B2 | 3/2011 | Hirano et al. | |
| 7,985,392 | B2 | 7/2011 | Hayashi et al. | |
| 7,998,601 | B2 | 8/2011 | Mack et al. | |
| 8,017,872 | B2 | 9/2011 | Cripe et al. | |
| 8,075,185 | B2 | 12/2011 | Hecht et al. | |
| 8,076,185 | B1 * | 12/2011 | Lower et al. | 438/127 |
| 8,084,855 | B2 * | 12/2011 | Lower et al. | 257/701 |
| 8,119,040 | B2 | 2/2012 | Lower et al. | |
| 8,174,830 | B2 | 5/2012 | Lower et al. | |
| 2001/0015443 | A1 | 8/2001 | Komoto | |
| 2001/0030493 | A1 | 10/2001 | Noda et al. | |
| 2001/0046933 | A1 | 11/2001 | Parkhill et al. | |
| 2002/0000630 | A1 | 1/2002 | Coyle | |
| 2002/0054976 | A1 * | 5/2002 | Nakamura et al. | 428/66.6 |
| 2002/0076192 | A1 | 6/2002 | Bartholomew et al. | |
| 2002/0078856 | A1 | 6/2002 | Hahn et al. | |
| 2002/0086115 | A1 | 7/2002 | Lamers et al. | |
| 2002/0170173 | A1 | 11/2002 | Mashino | |
| 2002/0189495 | A1 | 12/2002 | Hayashi et al. | |
| 2002/0189894 | A1 | 12/2002 | Davis et al. | |
| 2003/0047735 | A1 | 3/2003 | Kyoda et al. | |
| 2003/0080341 | A1 | 5/2003 | Sakano et al. | |
| 2003/0218258 | A1 * | 11/2003 | Charles et al. | 257/783 |
| 2003/0228424 | A1 | 12/2003 | Dove et al. | |
| 2004/0106037 | A1 | 6/2004 | Cho et al. | |
| 2004/0116577 | A1 | 6/2004 | Naruse et al. | |
| 2004/0156995 | A1 | 8/2004 | Komiyama et al. | |
| 2004/0194667 | A1 * | 10/2004 | Reuscher | 106/600 |
| 2005/0003947 | A1 | 1/2005 | Mazany et al. | |
| 2005/0082691 | A1 | 4/2005 | Ito et al. | |
| 2005/0099775 | A1 | 5/2005 | Pokharna et al. | |
| 2005/0116237 | A1 | 6/2005 | Voutsas | |
| 2005/0123684 | A1 | 6/2005 | Makowski et al. | |
| 2005/0179742 | A1 | 8/2005 | Keenan et al. | |
| 2006/0045755 | A1 | 3/2006 | McDonald et al. | |
| 2006/0068218 | A1 | 3/2006 | Hooghan et al. | |
| 2006/0095677 | A1 | 5/2006 | Hakura et al. | |
| 2006/0113066 | A1 | 6/2006 | Mongia et al. | |
| 2006/0135342 | A1 | 6/2006 | Anderson et al. | |
| 2006/0158849 | A1 | 7/2006 | Martin et al. | |
| 2006/0250731 | A1 | 11/2006 | Parkhurst et al. | |
| 2006/0268525 | A1 | 11/2006 | Jeong | |
| 2006/0283546 | A1 | 12/2006 | Tremel et al. | |
| 2007/0075323 | A1 | 4/2007 | Kanazawa et al. | |
| 2007/0102833 | A1 | 5/2007 | Hack et al. | |
| 2007/0108586 | A1 | 5/2007 | Uematsu et al. | |
| 2007/0224400 | A1 | 9/2007 | Meguro et al. | |
| 2008/0006204 | A1 | 1/2008 | Rusinko et al. | |
| 2008/0050512 | A1 | 2/2008 | Lower et al. | |
| 2008/0063875 | A1 * | 3/2008 | Robinson et al. | 428/426 |
| 2008/0142966 | A1 | 6/2008 | Hirano et al. | |
| 2008/0299300 | A1 | 12/2008 | Wilcoxon et al. | |
| 2009/0110904 | A1 | 4/2009 | Mack et al. | |
| 2009/0183774 | A1 | 7/2009 | Atanackovic | |
| 2009/0246355 | A9 | 10/2009 | Lower et al. | |
| 2009/0279257 | A1 | 11/2009 | Lower et al. | |
| 2010/0064518 | A1 | 3/2010 | Lower et al. | |
| 2010/0064695 | A1 | 3/2010 | Wilcoxon et al. | |
| 2010/0065256 | A1 | 3/2010 | Wilcoxon et al. | |
| 2010/0066178 | A1 | 3/2010 | Lower et al. | |
| 2010/0078605 | A1 | 4/2010 | Lower et al. | |
| 2012/0118623 | A1 | 5/2012 | Lower et al. | |

FOREIGN PATENT DOCUMENTS

| | | |
|---|---|---|
| JP | 57-027942 * | 2/1982 |
| JP | 60-013875 * | 1/1985 |
| JP | 02-064071 * | 3/1990 |
| JP | 11-095246 | 4/1994 |
| JP | 2003-332505 A | 11/2003 |
| JP | 2006-045420 | 2/2006 |
| WO | WO-2006/095677 | 9/2006 |
| WO | WO 2006/095677 A1 | 9/2006 |
| WO | PCT/US2008/074224 | 8/2008 |

(56) References Cited

FOREIGN PATENT DOCUMENTS

WO PCT/US2008/075591 9/2008
WO PCT/US2009/031699 1/2009

OTHER PUBLICATIONS

U.S. Appl. No. 12/240,775, filed Sep. 29, 2008, Lower et al.
U.S. Appl. No. 12/116,126, filed May 6, 2008, Lower et al.
U.S. Appl. No. 11/784,932, filed Apr. 10, 2007, Lower et al.
U.S. Appl. No. 11/732,981, filed Apr. 5, 2007, Wilcoxon et al.
U.S. Appl. No. 11/732,982, filed Apr. 5, 2007, Boone et al.
U.S. Appl. No. 11/784,158, filed Apr. 5, 2007, Lower et al.
U.S. Appl. No. 11/508,782, filed Aug. 23, 2006, Lower et al.
Click, et al., "Schott Low Temperature Bonding for Precision Optics," can be found at website: http://optics.nasa.gov/tech_days/tech_days_2004/docs/18%20Aug%202004/23%20Schott%20Low%20Temperature%20Bonding.pdf, p. 20.
Lewis, J. A., et al., Materialstoday: Jul./Aug. 2004, Direct Writing in three dimension, ISSN: 1369 7021 © Elsevier Ltd 2004, pp. 32-39.
Optomec® Systems M3D® Breakthrough Technology for Printable Electronics, pp. 1-2.
PQ Corporation, "Bonding and Coating Applications of PQ® Soluble Silicates," Bulletin 12-31, (2003) p. 7.
PQ Corporation, PQ® Soluble Silicates in Refractory and Chemical-Resistant Cements, Bulletin 24-1, (2003), p. 6.
Thresh, John C., "The Action of Natural Waters on Lead," The Analyst, vol. XLVII, No. 560, (Nov. 1922) pp. 459-468.
Non-Final Office Action for U.S. Appl. No. 11/784,932, dated Apr. 3, 2009, 8 pages.
Non-Final Office Action for U.S. Appl. No. 11/784,158, dated Apr. 21, 2009, 10 pages.
Final Office Action for U.S. Appl. No. 11/508,782, dated Jun. 16, 2009, 13 pages.
International Search Report and Written Opinion for Application No. PCT/US2009/036355, mail date Jun. 30, 2009, 11 pages.
International Search Report and Written Opinion for Application No. PCT/US2009/031699, mail date Aug. 18, 2009, 16 pages.
Office Action for U.S. Appl. No. 11/784,158, mail date Oct. 8, 2009, 7 pages.
Response to Office Action for U.S. Appl. No. 11/784,158 filed with the U.S. Patent and Trademark Office on Jan. 8, 2010, 10 pages.
Office Action for U.S. Appl. No. 12/116,126, mail date Nov. 20, 2009, 7 pages.
Response to Office Action for U.S. Appl. No. 12/116,126 filed with the U.S. Patent and Trademark Office on Feb. 22, 2010, 10 pages.
Office Action for U.S. Appl. No. 11/784,932, mail date Feb. 16, 2010, 11 pages.
Office Action for U.S. Appl. No. 11/508,782, mail date Feb. 24, 2010, 14 pages.
Office Action for U.S. Appl. No. 11/784,158, mail date Mar. 26, 2010, 7 pages.
Office Action for U.S. Appl. No. 12/116,126, mail date Apr. 22, 2010, 7 pages.
Office Action for U.S. Appl. No. 11/784,158, mail date Jun. 17, 2010, 7 pages.
Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/RAMS/no_1604/golubev/golubev.pdf.
International Search Report and Written Opinion for International Application No. PCT/US2008/074224, mail date Jan. 30, 2009, 10 pages.
International Search Report and Written Opinion for International Application No. PCT/US2008/075591, mail date Apr. 8, 2009, 7 pages.
Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.
Mysen, B. et al. Silicate Glasses and Melts, vol. 10: Properties and Structure (Developments in Geochemistry) (Book Description), website: http://www.amazon.com/Silicate-Glasses-Melts-Developments-Geochemistry/dp/0444520112, 4 pgs.
Nascimento, M. L. F., et al. Universal curve of ionic conductivities in binary alkali silicate glasses, Journal of Materials Science (2005), Springer Science + Business Media, Inc., website: http://www.springerlink.com/content/p7535075x1872016/, 3 pgs.
Notice of Allowance for U.S. Appl. No. 11/784,158, mail date Nov. 29, 2010, 8 pages.
Office Action for U.S. Appl. No. 11/508,782, mail date Sep. 2, 2010, 14 pages.
Office Action for U.S. Appl. No. 12/284,670, mail date Sep. 28, 2010, 11 pages.
Office Action for U.S. Appl. No. 11/732,981, mail date Oct. 6, 2010, 10 pages.
Office Action for U.S. Appl. No. 12/116,126, mail date Oct. 25, 2010, 9 pages.
Office Action for U.S. Appl. No. 11/784,932, mail date Nov. 10, 2010, 10 pages.
Office Action for U.S. Appl. No. 12/286,207, mail date Dec. 27, 2010, 15 pages.
Office Action for U.S. Appl. No. 11/508,782, mail date Jan. 19, 2011, 10 pages.
Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract only) website: http://pubs.acs.org/doi/abs/10.1021/cm062619r, 2 pgs.
Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02.A05.pdf, 5 pgs.
The Mixed—Alkali Effect for the Viscosity of Glasses, printed on Dec. 3, 2010 from website: http://glassproperties.com/viscosity/mixed-alkali-effect-viscosity/, 7 pages.
The Structure of Glasses. Alkali silicate glasses, printed on Dec. 3, 2010 from website: http://www.ptc.tugraz.at/specmag/struct/ss.htm, 1 page.
International Search Report and Written Opinion for International Application No. PCT/US2008/074224, mail date Jan. 30, 2009, 9 pages.
Office Action for U.S. Appl. No. 11/732,982, mail date Feb. 2, 2011, 16 pages.
Office Action for U.S. Appl. No. 12/284,670, mail date Feb. 17, 2011, 13 pages.
Office Action for U.S. Appl. No. 12/116,126, mail date Feb. 25, 2011, 9 pages.
Office Action for U.S. Appl. No. 11/732,981, mail date Mar. 16, 2011, 7 pages.
Notice of Allowance for U.S. Appl. No. 12/284,670, mail date May 11, 2011, 7 pages.
Notice of Allowance for U.S. Appl. No. 11/784,932, mail date May 12, 2011, 11 pages.
Notice of Allowance for U.S. Appl. No. 11/508,782, mail date May 31, 2011, 9 pages.
Notice of Allowance for U.S. Appl. No. 12/286,207, mail date Jun. 27, 2011, 12 pages.
Office Action for U.S. Appl. No. 12/116,126, mail date May 10, 2011, 8 pages.
Office Action for U.S. Appl. No. 12/240,775, mail date May 26, 2011, 10 pages.
Office Action for U.S. Appl. No. 11/732,982, mail date Jun. 21, 2011, 15 pages.
Amendment and Reply for U.S. Appl. No. 11/508,782, mail date Sep. 2, 2008, 7 pages.
Office Action for U.S. Appl. No. 11/508,782, mail date Dec. 24, 2008, 9 pages.
Amendment and Reply for U.S. Appl. No. 11/508,782, mail date Mar. 24, 2009, 10 pages.
Amendment and Reply for U.S. Appl. No. 11/508,782, mail date Aug. 14, 2009, 12 pages.

(56) References Cited

OTHER PUBLICATIONS

Advisory Action for U.S. Appl. No. 11/508,782, mail date Aug. 31, 2009, 3 pages.
Response for U.S. Appl. No. 11/508,782, mail date Nov. 13, 2009, 14 pages.
Amendment and Reply for U.S. Appl. No. 11/508,782, mail date Jun. 24, 2010, 10 pages.
Amendment and Reply for U.S. Appl. No. 11/508,782, mail date Nov. 2, 2010, 12 pages.
Supplemental Amendment and Reply for U.S. Appl. No. 11/508,782, mail date Nov. 3, 2010, 3 pages.
Request for Continued Examination for U.S. Appl. No. 11,508,782, mail date Dec. 2, 2010, 10 pages.
Examiner Interview Summary for U.S. Appl. No. 11/508,782, mail date Jan. 5, 2011, 2 pages.
Amendment and Reply for U.S. Appl. No. 11/508,782, mail date Apr. 5, 2011, 9 pages.
Notice of Allowance for U.S. Appl. No. 11/508,782, mail date Jul. 26, 2011, 4 pages.
Request for Continued Examination for U.S. Appl. No. 11/508,782, mail date Aug. 30, 2011, 6 pages.
Notice of Allowance for U.S. Appl. No. 11/508,782, mail date Sep. 20, 2011, 7 pages.
Request for Continued Examination for U.S. Appl. No. 11/732,982, mail date Aug. 22, 2011, 11 pages.
Office Action for U.S. Appl. No. 11/732,982, mail date Sep. 14, 2011, 13 pages.
Amendment and Reply for U.S. Appl. No. 11/732,982, mail date Jan. 13, 2012, 11 pages.
Amendment and Reply for U.S. Appl. No. 11/784,158, mail date May 26, 2010, 12 pages.
Terminal Disclaimer for U.S. Appl. No. 11/784,158, mail date May 26, 2010, 1 page.
Terminal Disclaimer Decision for U.S. Appl. No. 11/784,158, mail date Jun. 8, 2010, 1 page.
Amendment and Reply for U.S. Appl. No. 12/116,126, mail date Aug. 10, 2011, 11 pages.
Office Action for U.S. Appl. No. 12/116,126, mail date Sep. 12, 2011, 11 pages.
Amendment and Reply for U.S. Appl. No. 12/116,126, mail date Dec. 12, 2011, 10 pages.
Amendment and Reply for U.S. Appl. No. 12/240,775, mail date Sep. 26, 2011, 11 pages.
Restriction Requirement for U.S. Appl. No. 12/240,775, mail date Jan. 12, 2012, 5 pages.
Request for Continued Examination for U.S. Appl. No. 11/732,981, mail date May 16, 2011, 12 pages.
Terminal Disclaimer for U.S. Appl. No. 11/732,981, mail date May 16, 2011, 1 page.
Terminal Disclaimer Decision for U.S. Appl. No. 11/732,981, mail date Jul. 11, 2011, 1 page.
Notice of Allowance for U.S. Appl. No. 11/732,981, mail date Jul. 26, 2011, 7 pages.
Request for Continued Examination for U.S. Appl. No. 11/732,981, mail date Oct. 25, 2011, 4 pages.
Notice of Allowance for U.S. Appl. No. 11/732,981, mail date Dec. 29, 2011, 7 pages.
Response for U.S. Appl. No. 11/784,932, mail date Jul. 2, 2009, 8 pages.
Request for Continued Examination for U.S. Appl. No. 11/784,932, mail date Aug. 10, 2011, 6 pages.
Notice of Allowance for U.S. Appl. No. 11/784,932, mail date Aug. 23, 2011, 8 pages.
Notice of Allowance for U.S. Appl. No. 12/286,207, mail date Oct. 6, 2011, 8 pages.
U.S. Appl. No. 12/284,670, filed Sep. 24, 2008.
Advisory Action for U.S. Appl. No. 12/116,126, mail date Jun. 29, 2010, 4 pages.
Advisory Action for U.S. Appl. No. 12/240,775, mail date Nov. 14, 2012, 2 pages.
Amendment and Reply for U.S. Appl. No. 12/116,126, mail date Jul. 22, 2010, 9 pages.
Amendment and Reply for U.S. Appl. No. 11/732,981, mail date Jan. 6, 2011, 9 pages.
Amendment and Reply for U.S. Appl. No. 11/732,982, mail date Jun. 14, 2012, 11 pages.
Amendment and Reply for U.S. Appl. No. 11/732,982, mail date May 2, 2011, 12 pages.
Amendment and Reply for U.S. Appl. No. 11/732,982, mail date Oct. 25, 2010, 6 pages.
Amendment and Reply for U.S. Appl. No. 11/732,982, mail date Sep. 28, 2012, 7 pages.
Amendment and Reply for U.S. Appl. No. 11/784,158, mail date Jul. 21, 2009, 10 pages.
Amendment and Reply for U.S. Appl. No. 11/784,932, mail date Jun. 14, 2010, 9 pages.
Amendment and Reply for U.S. Appl. No. 11/959,225, mail date Aug. 24, 2009, 2 pages.
Amendment and Reply for U.S. Appl. No. 12/116,126, mail date Apr. 29, 2011, 9 pages.
Amendment and Reply for U.S. Appl. No. 12/116,126, mail date Jan. 25, 2011, 8 pages.
Amendment and Reply for U.S. Appl. No. 12/116,126, mail date Jun. 22, 2010, 7 pages.
Amendment and Reply for U.S. Appl. No. 12/240,775, mail date Jul. 2, 2012, 12 pages.
Amendment and Reply for U.S. Appl. No. 12/240,775, mail date Nov. 6, 2012, 8 pages.
Amendment and Reply for U.S. Appl. No. 12/284,670, mail date Apr. 18, 2011, 9 pages.
Amendment and Reply for U.S. Appl. No. 12/286,207, mail date Mar. 28, 2011, 12 pages.
Amendment and Reply for U.S. Appl. No. 12/493,022, mail date Aug. 28, 2012, 7 pages.
Amendment and Reply for U.S. Appl. No. 12/493,022, mail date Mar. 23, 2012, 3 pages.
Amendment and Reply for U.S. Appl. No. 13/359,105, mail date Aug. 8, 2012, 10 pages.
Notice of Allowance for U.S. Appl. No. 11/732,982, mail date Dec. 19, 2012, 2 pages.
Notice of Allowance for U.S. Appl. No. 11/732,982, mail date Nov. 8, 2012, 8 pages.
Notice of Allowance for U.S. Appl. No. 12/116,126, mail date Jan. 5, 2012, 10 pages.
Notice of Allowance for U.S. Appl. No. 12/493,022, mail date Sep. 20, 2012, 5 pages.
Office Action for U.S. Appl. No. 11/732,982, mail date Apr. 16, 2012, 15 pages.
Office Action for U.S. Appl. No. 11/732,982, mail date Jul. 3, 2012, 15 pages.
Office Action for U.S. Appl. No. 12/240,775, mail date Apr. 2, 2012, 8 pages.
Office Action for U.S. Appl. No. 12/240,775, mail date Sep. 6, 2012, 9 pages.
Office Action for U.S. Appl. No. 12/493,022, mail date May 30, 2012, 13 pages.
Office Action for U.S. Appl. No. 13/359,105, mail date Jan. 17, 2013, 7 pages.
Office Action for U.S. Appl. No. 13/359,105, mail date May 8, 2012, 12 pages.
Office Action for U.S. Appl. No. 13/359,105, mail date Oct. 19, 2012, 7 pages.
Request for Continued Examination for U.S. Appl. No. 11/784,932, mail date Jun. 14, 2010, 4 pages.
Request for Continued Examination for U.S. Appl. No. 12/116,126, mail date Apr. 29, 2011, 4 pages.
Request for Continued Examination for U.S. Appl. No. 12/116,126, mail date Jul. 22, 2010, 4 pages.
Request for Continued Examination for U.S. Appl. No. 12/286,207, mail date Sep. 26, 2011, 4 pages.
Restriction Requirement for U.S. Appl. No. 11/732,982, mail date Sep. 24, 2010, 5 pages.

(56) References Cited

OTHER PUBLICATIONS

Restriction Requirement for U.S. Appl. No. 12/493,022, mail date Feb. 22, 2012, 6 pages.
Restriction Requirement for U.S. Appl. No. 13/329,068, mail date Jan. 15, 2013, 5 pages.
Technical Standard Order, TSO-C115b, Airborne Area Navigation Equipment Using Multi-Sensor Inputs, Department of Transportation, Federal Aviation Administration, Sep. 30, 1994, 11 pages.
Techpowerup, "NanoCoolers puts liquid metal in your PC," website: http://www.techpowerup.com/?3105, May 4, 2005, 19 pages.
Amendment and Reply for U.S. Appl. No. 13/287,734, mail date Jul. 9, 2013, 10 pages.
Notice of Allowance for U.S. Appl. No. 11/732,982, mail date Jul. 10, 2013, 6 pages.
Notice of Allowance for U.S. Appl. No. 13/359,105, mail date Jun. 24, 2013, 9 pages.
Office Action for U.S. Appl. No. 13/329,068, mail date Jun. 7, 2013, 6 pages.
Office Action for U.S. Appl. No. 13/287,734, mail date Apr. 11, 2013, 18 pages.

* cited by examiner

ADHESIVE APPLICATIONS USING ALKALI SILICATE GLASS FOR ELECTRONICS

BACKGROUND

The present application relates to electronics assemblies, and more particularly, to electronics assemblies such as integrated circuit assemblies that utilize an alkali silicate glass material to couple or join components of such assembly together.

Components of integrated circuit assemblies are often coupled together using adhesive materials (e.g., organic adhesive materials such as die attach, thermal epoxies, silver-filled epoxies, and anisotropic adhesives).

One disadvantage associated with conventional adhesive materials is that such materials can absorb moisture, which may degrade the adhesive materials and/or the interfaces to the materials that they connect through chemical decomposition, material expansion, and the like. Other factors such as exposure to elevated temperatures, ozone, or ultraviolet light can also degrade some organic adhesive materials. In addition, organic-based adhesives typically have coefficients of thermal expansion on the order of 100 ppm per degree Celsius, which can lead to adhesion and/or cohesion failures when components, such as silicon integrated circuits (3 ppm per degree Celsius) are subjected to temperature variations. This potential degradation of the adhesive materials and their interfaces to the structures within electronics components can limit their suitability for use in harsh environments, and can lead to failures during the operational lifetime of the devices.

Accordingly, there is a need for an improved method of coupling or attaching electronic components in integrated circuit assemblies. There is also a need for a material that may act to secure such components together that can be processed and cured at relatively low temperatures in a reliable manner and which is relatively robust when exposed to harsh environments (e.g., environments that may promote degradation of conventional organic adhesive materials).

SUMMARY

An exemplary embodiment of the invention relates to an assembly that includes an integrated circuit die coupled to another component of the assembly with an alkali silicate glass material.

Another exemplary embodiment of the invention relates to an electronics package that includes a first electronic component and a second electronic component mechanically coupled to the first electronic component with an alkali silicate glass material.

Another exemplary embodiment of the invention relates to a method for producing an integrated circuit assembly that includes providing a first electronic component and providing an alkali silicate material solution on at least one surface of the first electronic component. The alkali silicate material solution comprising water with alkali oxide and silica components. The method further includes providing a second electronic component in contact with the alkali silicate material solution and curing the alkali silicate material solution to remove the water and to mechanically couple the first electronic component to the second electronic component.

DETAILED DESCRIPTION

Figure 1:
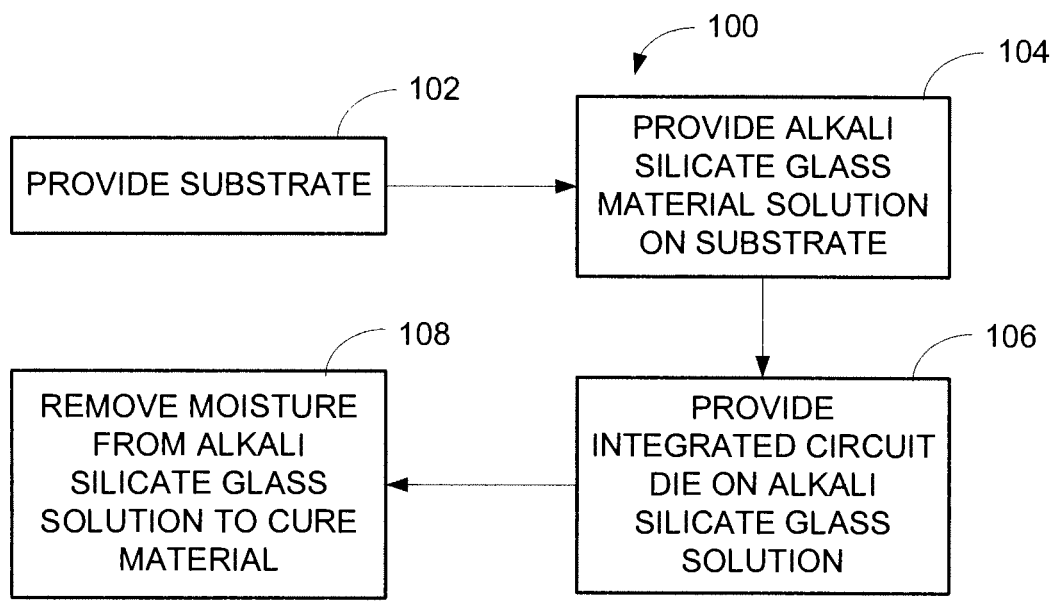
FIG. 1 is a flow diagram illustrating the steps in a method for producing an integrated circuit assembly according to an exemplary embodiment.

According to an exemplary embodiment, an alkali silicate glass material is used as a material for coupling or joining one or more electronic components together (e.g., in place of more conventional adhesive materials such as an epoxy-based die attach material). The alkali silicate glass material is provided in the form of a liquid solution that is provided between the surfaces of two components to be joined together. The solution is then cured to remove the water therefrom, which leaves a solid, moisture-impermeable material that adheres the two surfaces together.

The alkali silicate glass material advantageously exhibits dielectric material properties that are similar to or better than current adhesive materials. In contrast to more traditional adhesive materials, however, the alkali silicate glass materials are relatively resistant to moisture (i.e., the material generally will not absorb moisture), which makes such materials suitable for use in environments in which humidity absorption can degrade the mechanical properties of the substrate and/or modify its electrical characteristics.

According to an exemplary embodiment, an alkali silicate material is provided in solution with a liquid such as deionized water, after which the water is removed from the solution such that the remaining alkali silicate glass material may act to couple or join two or more electronic components together. The solution may include one or more alkali silicates, such as lithium, sodium, rubidium, cesium, or francium silicate materials. The solution may include a single type of alkali silicate (e.g., lithium silicate) or more than one type (e.g., a 1:1 molar ratio of lithium silicate and potassium silicate or a 1:1 molar ratio of lithium silicate and sodium silicate).

Liquid alkali silicate solutions are commercially available from companies such as PQ Corporation of Malvern, Pa. in a wide variety of $SiO_2$ to $M_2O$ weight ratios (this ratio may be referred to as the "r value" for the solution). For example, solutions having r values of between 1.00 and 3.5 may be obtained. These solutions may be used as-is or may be further modified (e.g., by adding deionized water to the solution, by adding particles to modify its thermal expansion coefficient or other characteristics, etc.). The particular materials utilized may vary depending on the desired application, material properties, and other factors according to various exemplary embodiments.

Highly siliceous liquid alkali silicate solutions tend to air dry rapidly, are the most refractory (high melting temperature), and are the most resistant to acids and corrosion. These silica rich liquid solutions tend to contain more water than alkaline rich solutions (per similar viscosity), and thus undergo greater shrinkage while curing. Low ratio, alkaline rich, solutions tend to have greater elasticity, lower brittleness, and less shrinkage but may exhibit poor corrosion resistance. These low ratio coatings also dry more slowly because their alkali content creates a greater affinity for water. Many chemically resistant cements and mortars are produced using high ratio (e.g., approximately 3.25) alkali silicate solutions.

In order for the alkali silicate materials to become moisture impermeable and relatively insoluble, the water must be completely removed from the solution. The alkali silicate solutions may be cured at relatively low temperatures (e.g., less than or equal to 160 degrees Celsius, and between approximately 95 and 100 degrees Celsius according to a particular exemplary embodiment) to remove the water and solidify the material, thereby reducing residual stresses and processing costs. According to other exemplary embodiments, curing temperatures of greater than 160 degrees Celsius may be utilized. According to still other exemplary embodiments, curing temperatures of less than 100 degrees Celsius may be used as desired (e.g., air drying may remove a sufficient degree of moisture from the material for a particular application, particularly in environments where there is not substantial ambient humidity). For example, according to one exemplary embodiments, an alkali silicate solution may be cured at a temperature of between approximately 120 and 160 degrees Celsius for a period of between approximately 120 and 240 minutes to remove the water therefrom (although it should be understood that different curing times and temperatures may be used according to various other exemplary embodiments). It is intended that once cured, the material will advantageously be capable of withstanding high temperatures (e.g., up to a glass transition temperature of approximately 700 degrees Celsius).

The alkali silicate glass material may include one or more types of fillers (e.g., particles) added thereto so as to provide enhanced electrical and/or thermal conduction for the material (e.g., to allow for electrical interconnection between the electronic components through the material). The alkali silicate glass material may also include materials therein for altering or modifying the thermal expansion characteristics of the material to allow it to better match the thermal expansion characteristics of the components to which it is coupled.

For example, high thermal conductivity particles, such as, but not limited to, diamond, aluminum nitride, beryllium oxide, or metals may be added to the solution prior to curing to improve the thermal conductivity of the resulting alkali silicate glass material. One possible application for such a material may be as a material for joining a heat spreader or similar component to another electronic component to remove heat from the electronic component.

Particles may also be added to modify the thermal expansion coefficient of the material. For example, a coefficient of thermal expansion (CTE) matching filler such as glass or ceramics may be added to the solution to modify the CTE of the final material, which may increase the utility of the material in applications such as underfills for flip-chip devices. This may improve its thermal cycle and shock loading reliability for high-temperature underfill applications (of greater than approximately 200 degrees Celsius). Current underfills, which are typically epoxy-based, are limited to relatively low operating temperatures (e.g., less than approximately 200 degrees Celsius) due to the fact that organics may decompose at higher temperatures.

The particles may be electrically and thermally conductive (e.g., metals and some semiconducting ceramics) according to an exemplary embodiment. According to other exemplary embodiments, the particles may be electrically insulating but thermally conductive (e.g., diamond, aluminum nitride, beryllium oxide, etc.).

According to another exemplary embodiment, the alkali silicate glass material may include nanoparticle modifiers, including, but not limited to, nano calcium carbonate, nano zinc oxide and nano silicon dioxide. Aqueous alkali silicate composite solutions applied on or between surfaces of materials, dry to form a tough, tightly adhering inorganic bond that exhibits many desirable characteristics.

According to an exemplary embodiment, the alkali silicate glass material may be used as to couple or join two or more components together in an electronics package (e.g., in a wire-bonded or flip chip integrated circuit assembly). Various exemplary embodiments illustrating the use of the alkali silicate glass material in this manner are described below.

Figure 2:
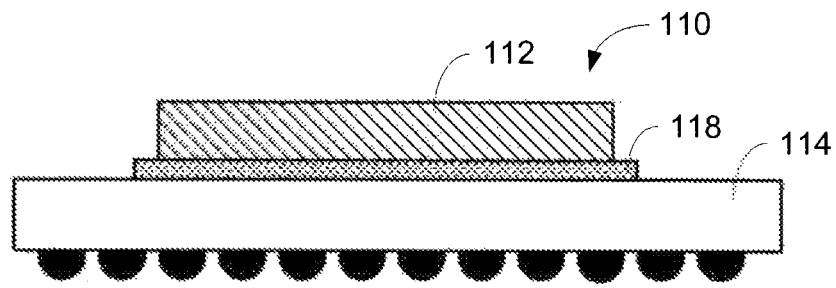
FIG. 2 is a schematic cross-sectional view of an integrated circuit assembly produced according to the method described with respect to FIG. 1 according to an exemplary embodiment.

FIG. 1 is a flow diagram illustrating steps in a method 100 for producing an integrated circuit assembly 110 according to an exemplary embodiment. FIG. 2 is a schematic cross-sectional view of an integrated circuit assembly 110 produced according to the method described with respect to FIG. 1.

As shown in FIG. 2, an integrated circuit 112 is coupled or joined to a substrate 114 (e.g., a silicon, alumina, aluminum nitride, silicon-germanium, or other type of suitable substrate) with an alkali silicate glass material 118. In this manner, the alkali silicate glass material 118 is intended to take the place of a conventional adhesive (e.g., an organic adhesive) that may be used to join the integrated circuit 112 to the substrate 114.

In a step 102 of the method 100, the substrate 114 is prepared and provided for assembly, after which an alkali silicate glass material solution 116 is provided on a top surface thereof in a step 104. According to an exemplary embodiment, the alkali silicate glass material solution 116 has a viscosity similar to that of liquid water. The thickness of the solution as provided may vary depending on the application and the material used. For example, if particle fillers are added to the alkali silicate solution, the minimum bond thickness may be limited by the size of the particles used. Where no particles are added, the bond thickness may be as low as desired (e.g., as low as approximately 200 nanometers). It should be understood that the viscosity and thickness of the solution may vary according to other exemplary embodiments.

According to an exemplary embodiment, the alkali silicate glass material solution 116 includes relatively small (e.g., between approximately 2 and 10 micrometer diameter) electrically conductive particles (e.g., particles of silver, tin, metal coated polymers, and/or other conductive materials) to allow it to be used as an anisotropically conductive adhesive (ACA) material that both mechanically bonds two surfaces together and provides electrical connection between locations on the surfaces. When the two horizontal surfaces are held against each other, the electrically conductive particles provide vertical electrical interconnect between aligned electrical pads, but because the radial distance between adjacent pads is much larger than the vertical distance between pads on the two surfaces, adjacent pads are not electrically connected. ACA's typically utilize an organic material as the adhesive, which limits their suitability in harsh environments. The use of the alkali silicate glass material 118, with appropriate electrical particles interspersed therein, is intended to provide an ACA that is less susceptible to moisture and corrosion. This material could then be used to provide the electrical interconnect and act as a mechanical underfill for flip chip attached components, for example, as described below with respect to FIGS. 5-8.

Figure 3:
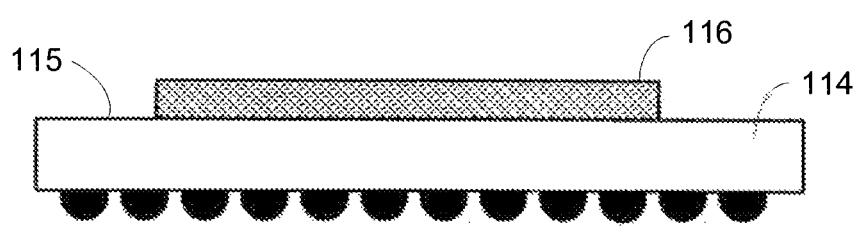
FIG. 3 is a schematic cross-sectional view of a substrate having an alkali silicate material solution provided thereon according to the method described with respect to FIG. 1.

After the alkali silicate glass material solution 116 is provided, the integrated circuit die 112 is provided on a top surface 117 of the alkali silicate glass material solution 116 in a step 106 as shown in FIG. 3.

Figure 4:
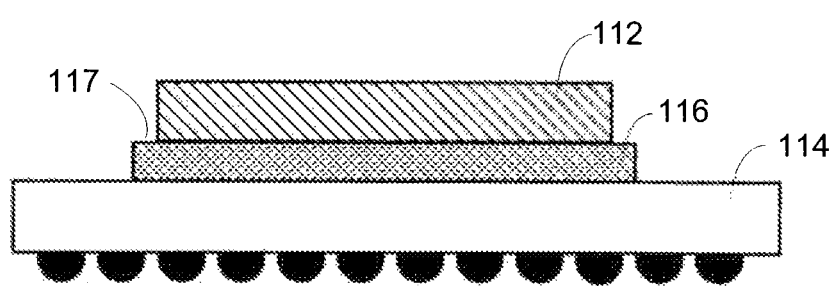
FIG. 4 is a schematic cross-sectional view of a substrate having an alkali silicate material solution and an integrated circuit die provided thereon according to the method described with respect to FIG. 1.

In a step 108 illustrated in FIG. 4, to permanently couple or join the integrated circuit die 112 to the substrate 114, the alkali silicate glass material solution 116 is cured at a relatively low temperature (e.g., less than or equal to approximately 160 degrees Celsius for a period of between approximately 120 and 240 minutes) to remove the moisture therefrom. The amount of shrinkage (if any) of the material will depend on the material used and other factors. For example, materials that include particles provided therein may be more resistant to shrinkage than those that do not.

Figure 5:
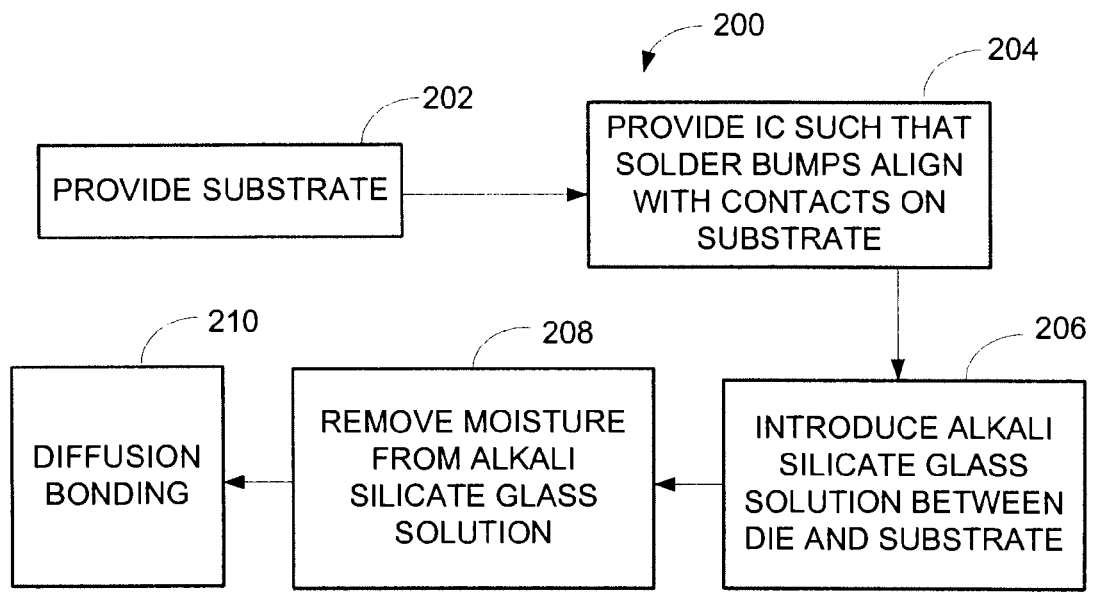
FIG. 5 is a flow diagram illustrating the steps in a method for producing a flip chip assembly according to an exemplary embodiment.
Figure 6:
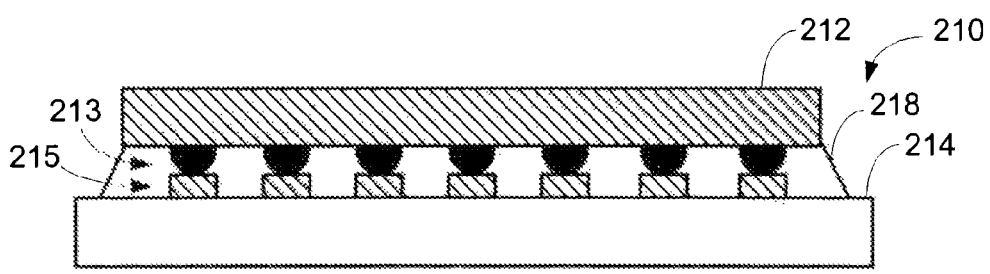
FIG. 6 is a schematic cross-sectional view of a flip chip assembly produced according to the method described with respect to FIG. 5 according to an exemplary embodiment.

FIG. 5 is a flow diagram illustrating steps in a method 200 for producing a flip chip integrated circuit assembly 210 according to another exemplary embodiment. FIG. 6 is a schematic cross-sectional view of a flip chip assembly 210 produced according to the method described with respect to FIG. 5.

Figure 7:
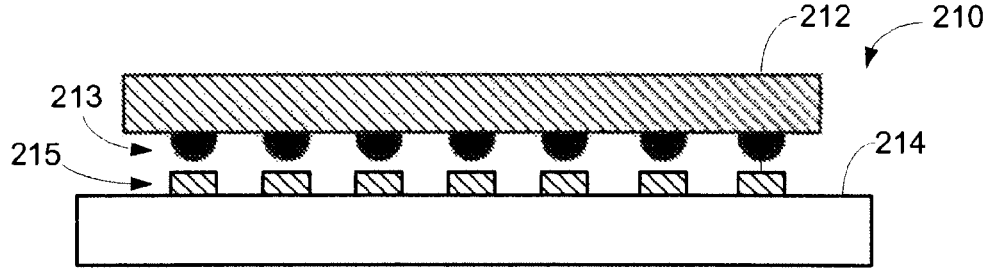
FIG. 7 is a schematic cross-sectional view of a flip chip assembly illustrating the positioning of the flip chip on a substrate in accordance with the method described with respect to FIG. 5.

As shown in FIG. 6, an integrated circuit 112 is provided in a step 202 that includes metal interconnect bumps 213 provided thereon for electrically coupling the integrated circuit 112 to an underlying substrate 214 in a flip chip configuration. As illustrated in FIG. 7, the metal bumps 213 are configured for alignment with contacts 215 provided on the substrate 214, as shown in FIG. 7. As the integrated circuit 212 is positioned on the substrate 214 in a step 204 shown in FIG. 8, the solder bumps make contact with the contacts 215 provided on the substrate 214. According to an exemplary embodiment, the metal bumps 213 and contacts 215 are formed from gold, copper, silver, tin, nickel or another metal or metal alloy.

Figure 8:
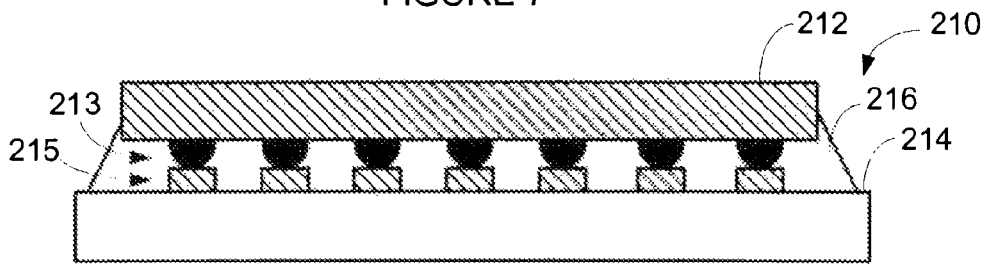
FIG. 8 is a schematic cross-sectional view of a flip chip assembly having an alkali silicate material solution introduced between a substrate and a flip chip in accordance with the method described with respect to FIG. 5.

In a step 206 shown in FIG. 8, an alkali silicate glass material solution 216 is provided as an underfill material for the flip chip assembly 210. The alkali silicate glass material solution 216 is then cured in a step 208 at a relatively low temperature (e.g., less than or equal to approximately 160 degrees Celsius) for an appropriate amount of time to remove the moisture therefrom (the curing time will depend on many factors, including, for example, the size of the device being bonded, the material used, the temperature used, and other factors).

In a step 210, diffusion bonding is performed to further couple the metal bumps 213 to the contacts 215 at a temperature of between approximately 200 and 300 degrees Celsius for a period of between approximately 3 and 5 minutes (although it should be understood that different times and temperature may be used according to other exemplary embodiments, and may vary depending on the material composition used). One advantageous feature of using the alkali silicate glass material 218 as an underfill material is that once cured, such material has a softening temperature of greater than approximately 700 degrees Celsius. Thus, during the subsequent diffusion bonding step 210, pressure is maintained between the metal bumps 213 and the contacts 215 at elevated temperatures, which is intended to speed metal diffusion required for the electrical and mechanical coupling of the components of the assembly 210.

To further enhance the diffusion bonding process, the alkali silicate glass solution 216 may include particles made from metals such as tin, silver, gold, indium, gallium, copper, nickel, bismuth, and other metals and alloys thereof. According to an exemplary embodiment, the alkali silicate glass solution 216 may include both a "parent" metal such as silver, gold, or copper as well as a low melting temperature metal such as tin, indium, gallium, bismuth, and other low melting temperature metals.

According to an exemplary embodiment, the particles (e.g., tin and silver particles) are provided at a loading volume of between approximately 10 and 70 percent. During the diffusion bonding process, the particles diffuse into the metal bumps 213 and contacts 215 to form a higher melting temperature alloy (e.g., where the metal bumps 213 and contacts 215 are formed from gold or a gold alloy, the addition of tin and/or silver produces an alloy in the interconnect bump that has a melting temperature that is higher than that of the original particles). One advantageous feature of using the alkali silicate glass to introduce tin into the diffusion bonding process is that the occurrence of metal oxidation may be reduced or eliminated (since the metal is not exposed to moisture or the ambient environment, particularly oxygen).

It should be noted that in addition to semiconductor substrates (e.g., silicon, silicon-germanium, gallium nitrogen, gallium arsenide, zinc oxide, sapphire, alumina, aluminum nitride, quartz, or other types of substrates), the method described with respect to FIGS. 5-8 may also be employed to adhere a bumped device flip chip device to a patterned indium tin oxide (ITO) coated glass material, such as that used in display technologies (it should be noted that other transparent conductive coatings may be used in display technologies, such as hydrogen impregnated alumina or other suitable materials). The relatively low curing temperatures and robustness of the cured material associated with alkali silicate glass may advantageously improve the reliability of these devices fabricated with chip on glass assembly processes.

It should also be noted that the examples described with respect to FIGS. 1-8 may also be applied to stacked die packaging assembly processes that utilize through silicon vias (TSVs) in which vias within an integrated circuit allow interconnections to be made between the active surface of the die and the back side of the die. Advantageous features of the alkali silicate glass material such as its relatively low coefficient of thermal expansion, moisture impermeability, and low temperature processing make this material particularly well-suited for multiple-die applications.

According to another exemplary embodiment, the alkali silicate glass material may include filler materials to enhance the thermal and/or electrical conductivity of the material. For example, an alkali silicate glass material may include filler materials such as diamond, aluminum nitride, beryllium oxide, silicon carbide, carbon nanotubes, graphite, pyrolytic graphite, metal fillers, or other suitable filler materials at a suitable volume loading (e.g., between approximately 50 and 90 percent). It should be understood that the material and volume loading may differ according to other exemplary embodiments depending on the particular application and desired performance characteristics. One advantageous feature of utilizing filler materials is that the resulting alkali silicate glass material may act both as a mechanical die attach material as well as a thermally and/or electrically conductive die attach material. Such filler materials may be used in conjunction with the alkali silicate glass material in conjunction with organic substrates, ceramic substrates, and stacked technologies such as silicon substrates or other devices.

Figure 9:
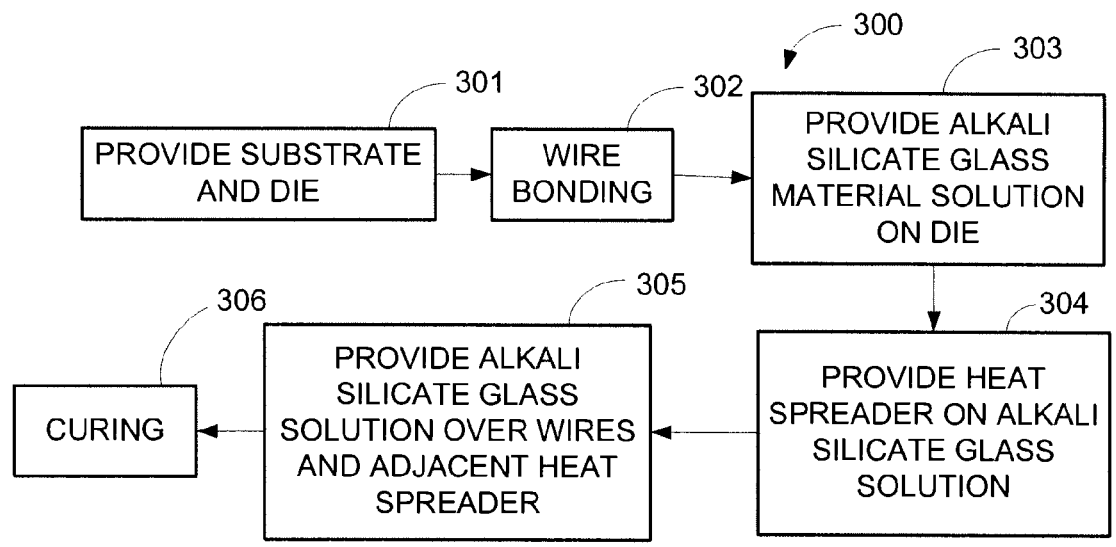
FIG. 9 is a flow diagram illustrating the steps in a method for producing an integrated circuit assembly according to another exemplary embodiment.
Figure 10:
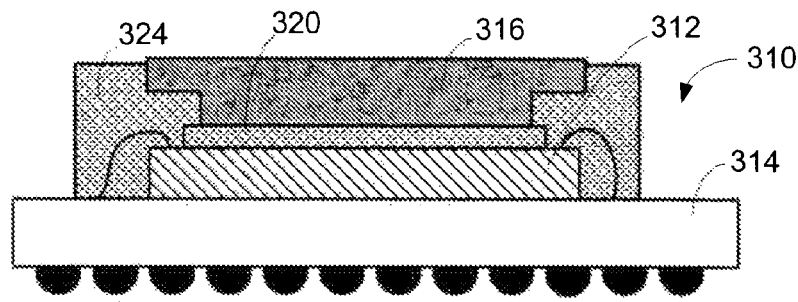
FIG. 10 is a schematic cross-sectional view of an integrated circuit assembly produced according to the method described with respect to FIG. 9 according to an exemplary embodiment.

FIG. 9 is a flow diagram illustrating steps in a method 300 for producing a wire bonded integrated circuit assembly 310 according to another exemplary embodiment. FIG. 10 is a schematic cross-sectional view of a wire bonded integrated circuit assembly 310 produced according to the method described with respect to FIG. 9. As shown in FIG. 10, the assembly 310 includes an integrated circuit die 312 provided on a substrate 314 in accordance with a step 301. A heat spreader 316 is provided above and coupled to the integrated circuit die 312.

Figure 11:
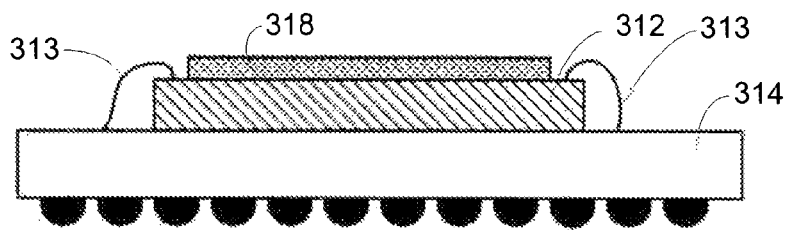
FIG. 11 is a schematic cross-sectional view of a substrate having an integrated circuit die and an alkali silicate material solution provided on the die according to the method described with respect to FIG. 9.

As shown in FIG. 11, in a step 302, a wire bonding operation is performed to electrically couple the integrated circuit die 312 to the substrate 314. Wires 313 may be made of any suitable electrically conductive material as is well known in the art.

In a step 303, an alkali silicate glass solution 318 is provided on the active side of the wire bonded integrated circuit 312. According to an exemplary embodiment, the alkali silicate glass solution 318 includes thermally conductive dielectric particles therein (e.g., diamond, etc.).

Figure 12:
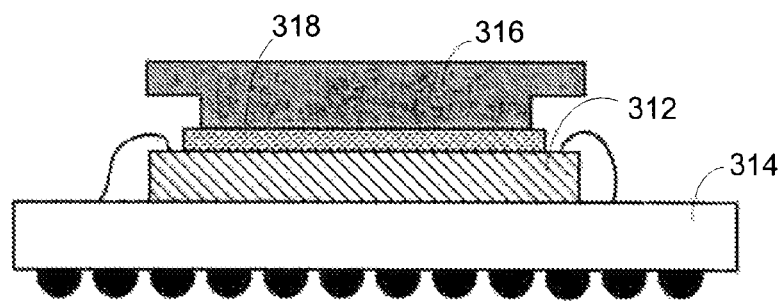
FIG. 12 is a schematic cross-sectional view of a substrate having an integrated circuit die and a heat spreader provided thereon according to the method described with respect to FIG. 9.
Figure 13:
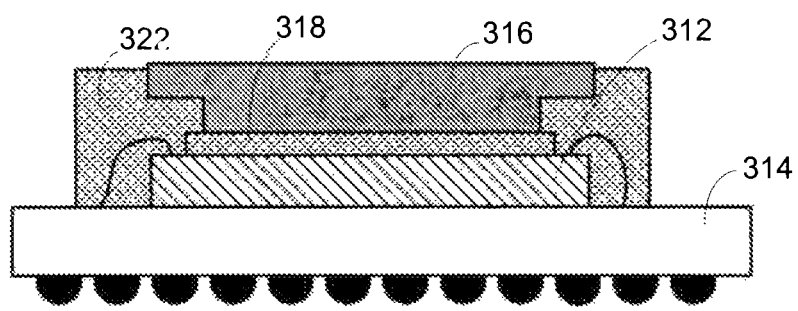
FIG. 13 is a schematic cross-sectional view illustrating the provision of an alkali silicate solution according to the method described with respect to FIG. 9.

A heat spreader 316 is provided in contact with the alkali silicate glass solution 318 in a step 304, as shown in FIG. 12, after which a second alkali silicate glass solution 322 is provided in a step 305 to encapsulate a portion of the assembly 310, as shown in FIG. 13. The alkali silicate glass solutions 318 and 322 are subsequently cured to remove the moisture therefrom, which results in solid alkali silicate glass regions 320 and 324. According to other exemplary embodiments, the alkali silicate glass solutions 318 and 322 may be cured in separate curing steps and/or the alkali silicate glass solutions 322 may be replaced with another type of encapsulation material such as epoxy-based materials.

As shown in FIG. 10, after the heat spreader 316 is attached to the integrated circuit die 312, the outer surface of the heat spreader 316 remains exposed for easy attachment to the next portion of the thermal path, such as the package lid, a finned heat sink, a heat pipe, or the like. The resulting device would be similar to a Quad Flatpack No Lead (QFN) or a flip chip device with an integrated heat spreader, except that the heat would not have to travel through the integrated circuit to go from the active surface to the heat spreader.

According to other exemplary embodiments, the alkali silicate glass materials may be used in a process to adhere two surfaces together to create a hermetic seal. For example, such material may be used to provide a low cost hermatic packaging method for devices that would otherwise use a glass frit, diffusion bonding, or welding. In addition to being lower cost, it would also be performed at much lower temperatures, making it suitable for devices such as MEMS and other products that require low temperature possessing.

Figure 14:
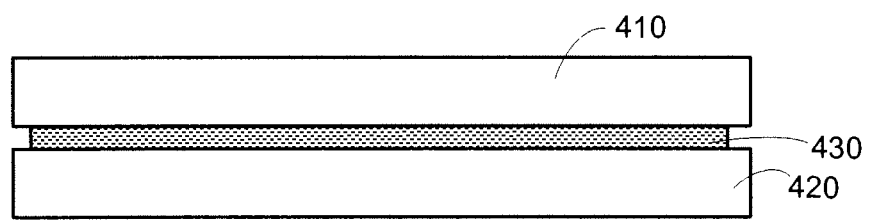
FIG. 14 is a schematic cross-sectional view illustrating two wafers or integrated circuit dies coupled together using an alkali silicate glass material according to an exemplary embodiment.

According to other exemplary embodiments, the alkali silicate glass material may be used to couple or attach integrated circuit wafers together as part of a Wafer Level Packaging (WLP) assembly process, as illustrated in FIG. 14, which illustrates two wafers 410 and 420 coupled together using an alkali silicate glass material 430. According to another exemplary embodiment, an alkali silicate glass material may be used to couple two integrated circuit dies together (as shown in FIG. 14, the wafers may be substituted with integrated circuit dies).

As will be appreciated by those reviewing the present disclosure, the use of alkali silicate glass materials to couple or join components of integrated circuit assemblies together provides various advantages over currently known technologies. For example, the relatively low moisture absorption and high chemical resistance of the cured alkali silicate glass provides enhanced long term reliability when used in harsh (humid, high temperature, corrosive, etc.) environments such as that experienced in avionics. Chemically inert particles can be added to the adhesive to modify its thermal expansion coefficient and thermal conductivity. Particles can also be added to modify the electrical properties of the material and/or to facilitate diffusion bonding when an alloying element is incorporated therein. Advantageously, the material may be cured at relatively low temperatures, which prevents damage to the surrounding components in the device.

Various features of alkali silicate glass materials in the context of coatings for integrated circuit and electronics packages are described in co-pending U.S. patent application Ser. No. 11/508,782, filed Aug. 23, 2006, the entire disclosure of which is incorporated herein by reference.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that references to relative positions (e.g., "top" and "bottom") in this description are merely used to identify various elements as are oriented in the FIGS. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the construction and arrangement of the components as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may be made in the design, operating conditions and arrangement of the various exemplary embodiments without departing from the scope of the present inventions as expressed in the appended claims.

What is claimed is:

1. An assembly comprising an integrated circuit die coupled to another component of the assembly with a solid alkali silicate glass material,
   wherein the alkali silicate glass material
      forms an inorganic bond coupling the integrated circuit die and the component together, and
      comprises a solid, moisture-impermeable material that adheres the integrated circuit die to the component.

2. The assembly of claim 1, wherein the alkali silicate glass material comprises at least one material selected from the group consisting of lithium silicate, sodium silicate, and potassium silicate.

3. The assembly of claim 2, wherein the alkali silicate glass material comprises lithium silicate and potassium silicate.

4. The assembly of claim 1, wherein the alkali silicate glass material comprises thermally conductive particles provided therein.

5. The assembly of claim 4, wherein the thermally conductive particles are also electrically conductive.

6. The assembly of claim 1, wherein the component is another integrated circuit die.

7. The assembly of claim 1, wherein the component is a heat spreader.

8. The assembly of claim 1, wherein the component is a substrate.

9. The assembly of claim 8, wherein the substrate comprises a transparent conductive coating provided on at least a portion thereof.

10. The assembly of claim 1, wherein the assembly is a flip chip assembly and the alkali silicate glass material is used as an underfill material.

11. The assembly of claim 1, wherein the alkali silicate glass material is based on a liquid alkali silicate solution having a $SiO_2$ to $M_2O$ eught ratio of between 1.00 and 3.5.

12. The assembly of claim 1, wherein the alkali silicate glass material has a softening temperature of greater than about 700 degrees Celsius.

13. The assembly of claim 1, wherein the alkali silicate glass material is not an organic adhesive.

14. An electronics package comprising:
   a first electronic component; and
   a second electronic component mechanically coupled to the first electronic component with a solid alkali silicate glass material,
   wherein the alkali silicate glass material
      forms an inorganic bond coupling together the first electronic component and the second electronic component, and
      comprises a solid, moisture-impermeable material that adheres the first electronic component to the second electronic component.

15. The electronics package of claim 14, wherein the alkali silicate glass material comprises at least one material selected from the group consisting of lithium silicate, sodium silicate, and potassium silicate.

16. The electronics package of claim 14, wherein the first and second electronic components are wafers.

17. The electronics package of claim 14, wherein the first electronic component is an integrated circuit die and the second electronic component is a substrate or an integrated circuit die.

18. The electronics package of claim 14, wherein the first electronic component is a heat spreader and the second electronic component is an integrated circuit die.

19. The electronics package of claim 14, wherein the alkali silicate glass material comprises a material for electrically coupling the first electronic component to the second electronic component.

20. The electronics package of claim 14, wherein the alkali silicate glass material comprises a material for providing improved thermal conductivity for the alkali silicate glass material.

21. The electronics package of claim 14, wherein the alkali silicate glass material comprises tin particles.

22. The electronics package of claim 14, wherein the electronics package is a flip chip package.

23. The electronics package of claim 14, wherein the alkali silicate glass material acts to form a hermetic seal between the components.

* * * * *